(12) United States Patent
Sakui et al.

(10) Patent No.: US 11,302,379 B2
(45) Date of Patent: Apr. 12, 2022

(54) SEMICONDUCTOR APPARATUS

(71) Applicants: HONDA MOTOR CO., LTD., Tokyo (JP); TOKYO INSTITUTE OF TECHNOLOGY, Tokyo (JP)

(72) Inventors: Koji Sakui, Wako (JP); Takayuki Ohba, Tokyo (JP)

(73) Assignees: HONDA MOTOR CO., LTD., Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 17/023,414

(22) Filed: Sep. 17, 2020

(65) Prior Publication Data

US 2021/0104272 A1  Apr. 8, 2021

(30) Foreign Application Priority Data

Oct. 4, 2019 (JP) .............................. JP2019-183605

(51) Int. Cl.
*G11C 5/06* (2006.01)
*G11C 11/4076* (2006.01)
*H01L 25/065* (2006.01)

(52) U.S. Cl.
CPC ...... *G11C 11/4076* (2013.01); *H01L 25/0657* (2013.01); *H01L 2225/06544* (2013.01)

(58) Field of Classification Search
CPC ............. G11C 11/4076; H01L 25/0657; H01L 2225/06544

(Continued)

(56) References Cited

U.S. PATENT DOCUMENTS 7,466,577 B2 * 12/2008 Sekiguchi ................ G11C 5/02
  257/686
7,830,692 B2 * 11/2010 Chung ..................... G11C 5/04
  365/51

(Continued)

FOREIGN PATENT DOCUMENTS

JP  2006-277870   10/2006
JP  2018-032141   3/2018

*Primary Examiner* — Viet Q Nguyen
(74) *Attorney, Agent, or Firm* — Amin, Turocy & Watson, LLP

(57) ABSTRACT

A semiconductor apparatus according to an embodiment of the present invention includes: a plurality of semiconductor chips that are laminated; a plurality of penetration electrodes that penetrate in a lamination direction through the plurality of semiconductor chips and that electrically connect together the plurality of semiconductor chips; and a plurality of input/output elements that are configured to perform a signal input/output operation to the plurality of penetration electrodes, wherein the semiconductor chips are joined together via no bump, one of the plurality of input/output elements is connected to each of the plurality of penetration electrodes such that a functional element connected to each of the plurality of penetration electrodes performs an ON or OFF operation at a predetermined timing, and the input/output element connected to a first of two adjacent penetration electrodes among the plurality of penetration electrodes and the input/output element connected to a second of two adjacent penetration electrodes are configured to perform the signal input/output operation at a different timing from each other.

8 Claims, 4 Drawing Sheets

(58) Field of Classification Search
USPC .................................................. 365/149, 63
See application file for complete search history.

(56) References Cited

U.S. PATENT DOCUMENTS

| | | | | |
|---|---|---|---|---|
| 7,990,747 | B2* | 8/2011 | Hankui | ................... H01L 23/48 |
| | | | | 365/63 |
| 8,054,663 | B2* | 11/2011 | Chung | ..................... G11C 5/02 |
| | | | | 365/51 |
| 8,681,525 | B2* | 3/2014 | Sato | .................... G06F 12/0207 |
| | | | | 365/63 |
| 9,123,399 | B2* | 9/2015 | Yoko | ..................... G11C 11/408 |
| 9,275,703 | B2* | 3/2016 | Lee | ....................... G11C 7/1042 |
| 9,378,775 | B2* | 6/2016 | Hayashi | ................. G11C 5/063 |
| 9,432,298 | B1* | 8/2016 | Smith | ................. H04L 49/9057 |
| 9,570,142 | B2* | 2/2017 | Shido | ................. G11C 11/4076 |
| 9,589,670 | B2* | 3/2017 | Kim | ..................... G11C 7/1078 |
| 10,020,046 | B1* | 7/2018 | Uemura | .............. G11C 11/4093 |
| 2012/0262196 | A1* | 10/2012 | Yokou | ................. G11C 29/025 |
| | | | | 324/750.3 |

\* cited by examiner

SEMICONDUCTOR APPARATUS

CROSS-REFERENCE TO RELATED APPLICATION

Priority is claimed on Japanese Patent Application No. 2019-183605, filed on Oct. 4, 2019, the contents of which are incorporated herein by reference.

BACKGROUND

Field of the Invention

The present invention relates to a semiconductor apparatus.

Background

In recent years, a HBM (High Bandwidth Memory) in which DRAM chips are laminated to enlarge a bandwidth and increase a speed has attracted attention (for example, refer to Japanese Unexamined Patent Application, First Publication No. 2018-32141 and Japanese Unexamined Patent Application, First Publication No. 2006-277870). A currently developed cutting-edge HBM2 is formed of laminated four chips and includes an input/output I/O of 1024 channels. In order to adapt to the speed of a CPU/GPU having a further increased speed, HBMs to be developed in the future are required to increase an input/output I/O number by one digit or two digits in some way and to achieve a further large-scale parallel processing (Parallelism).

SUMMARY

In order to realize a large-scale parallel processing having an increased input/output I/O number by one digit to two digits, it is necessary to narrow the number of TSV (Through Silicon Via) pitches from a current 100 μm pitch to a several 10 μm pitch, and finally to a 10 μm pitch. However, when a large number of TSVs stand at a pitch of 10 μm, the precise input and output of I/O data becomes difficult due to an impact of a noise associated with capacitive coupling between the TSVs. Such an electrical problem becomes more dominant as the pitch of the TSV becomes narrower.

An aspect of the present invention is intended to provide a semiconductor apparatus capable of preventing capacitive coupling between penetration electrodes (TSVs) formed in a narrow pitch.

A semiconductor apparatus according to a first aspect of the present invention includes: a plurality of semiconductor chips that are laminated; a plurality of penetration electrodes that penetrate in a lamination direction through the plurality of semiconductor chips and that electrically connect together the plurality of semiconductor chips; and a plurality of input/output elements that are configured to perform a signal input/output operation to the plurality of penetration electrodes, wherein the semiconductor chips are joined together via no bump, one of the plurality of input/output elements is connected to each of the plurality of penetration electrodes such that a functional element connected to each of the plurality of penetration electrodes performs an ON or OFF operation at a predetermined timing, and the input/output element connected to a first of two adjacent penetration electrodes among the plurality of penetration electrodes and the input/output element connected to a second of two adjacent penetration electrodes are configured to perform the signal input/output operation at a different timing from each other.

A second aspect of the present invention is the semiconductor apparatus according to the first aspect, wherein the plurality of input/output elements may be connected to an external electric power source that is configured to generate a clock signal, the input/output element connected to the first of two adjacent penetration electrodes may be configured to perform an input/output operation at a timing of rising of the generated clock signal, and the input/output element connected to the second of two adjacent penetration electrodes may be configured to perform an input/output operation at a timing of falling of the generated clock signal.

A third aspect of the present invention is the semiconductor apparatus according to the first aspect, wherein the plurality of input/output elements may be connected to an external electric power source that is configured to generate a clock signal, the input/output element connected to the first of two adjacent penetration electrodes may be configured to perform an input/output operation at a timing of rising or falling in an odd cycle of the generated clock signal, and the input/output element connected to the second of two adjacent penetration electrodes may be configured to perform an input/output operation at a timing of rising or falling in an even cycle of the generated clock signal.

A fourth aspect of the present invention is the semiconductor apparatus according to the first aspect, wherein the plurality of input/output elements may be connected to an external electric power source that is configured to generate a clock signal, and the input/output elements which are each connected to one of the penetration electrodes that are adjacent in one direction and the input/output elements which are each connected to one of the penetration electrodes that are adjacent in another direction may be configured to perform the signal input/output operation at a different timing from each other.

A fifth aspect of the present invention is the semiconductor apparatus according to the fourth aspect, wherein the input/output element connected to a first of two penetration electrodes that are adjacent in the one direction may be configured to perform an input/output operation at a timing of rising in an odd cycle of the generated clock signal, the input/output element connected to a second of two penetration electrodes that are adjacent in the one direction may be configured to perform an input/output operation at a timing of falling in the odd cycle of the generated clock signal, the input/output element connected to a first of two penetration electrodes that are adjacent in the other direction may be configured to perform an input/output operation at a timing of rising in an even cycle of the generated clock signal, and the input/output element connected to a second of two penetration electrodes that are adjacent in the other direction may be configured to perform an input/output operation at a timing of falling in the even cycle of the generated clock signal.

A sixth aspect of the present invention is the semiconductor apparatus according to any of the first to fifth aspects, wherein the plurality of penetration electrodes may be arranged to form a checker pattern.

A seventh aspect of the present invention may be the semiconductor apparatus according to any of the first to fifth aspects, wherein the plurality of penetration electrodes may be arranged to form a staggered grating pattern.

An eighth aspect of the present invention is the semiconductor apparatus according to any of the first to fifth aspects, wherein the plurality of penetration electrodes may be arranged to form a honeycomb pattern.

In the semiconductor apparatus according to the aspect of the present invention, functional elements on a different semiconductor chip are connected together via the plurality of penetration electrodes. The input/output element connected to the first of two adjacent penetration electrodes and the input/output element connected to the second of two adjacent penetration electrodes are configured to perform the input/output at a different timing from each other. Therefore, an input/output signal is not applied simultaneously to the two adjacent penetration electrodes. That is, when one changes from a H state to a L state or from the L state to the H state, another maintains the H state or the L state. Accordingly, in a case where the plurality of penetration electrodes are formed at a narrow pitch, the input/output signal applied to any of the penetration electrodes is not affected by a noise associated with capacitive coupling with another input/output signal, and the ON/OFF operation of the functional elements can be performed in a stable state.

DESCRIPTION OF THE EMBODIMENTS

Figure 1:
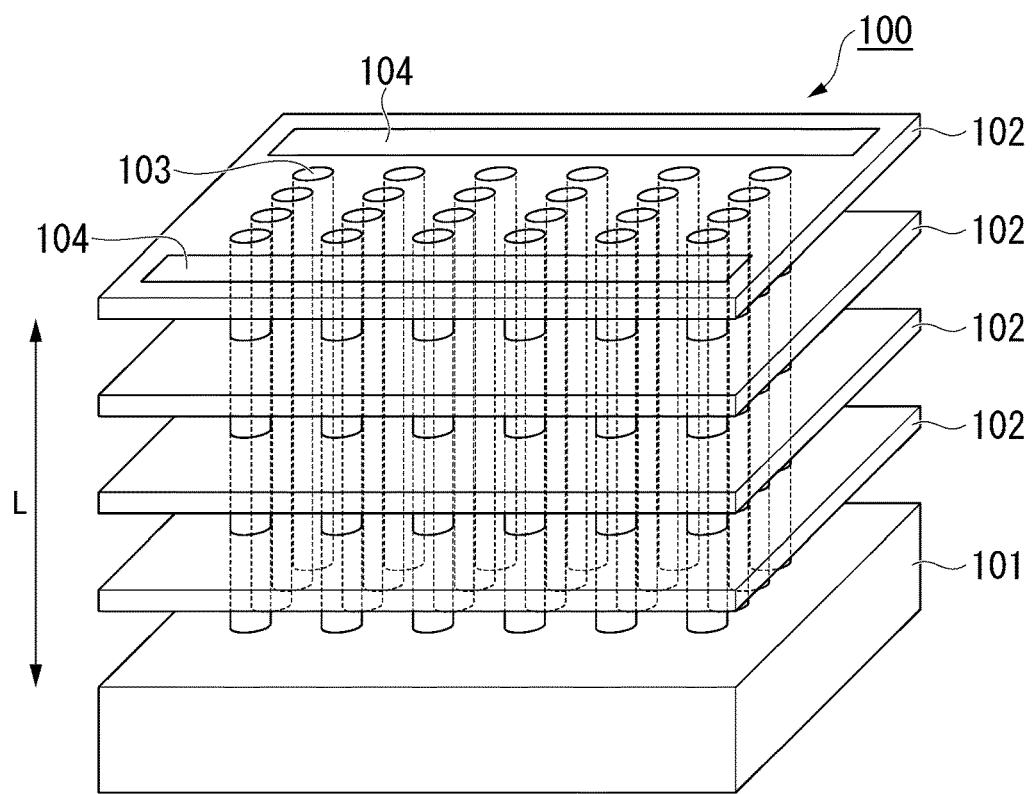
FIG. 1 is a perspective view of a semiconductor apparatus according to a first embodiment of the present invention.

Hereinafter, a semiconductor apparatus according to embodiments to which the present invention is applied will be described in detail with reference to the drawings. In order to make the features easy to understand, a characterizing portion may be enlarged in the drawings used in the following description for convenience, and the relative size or the like of each component is not necessarily the same as the actual dimensional ratio. The material, the size, and the like in the following description are merely examples, and the present invention is not limited thereto and can be appropriately changed without departing from the scope of the invention.

First Embodiment

FIG. 1 is a perspective view schematically showing a configuration of a semiconductor apparatus 100 according to a first embodiment of the present invention. The semiconductor apparatus 100 mainly includes a base substrate 101, a plurality of semiconductor chips 102 laminated on the base substrate 101, and a penetration electrode (TSV) 103 that penetrates through the plurality of semiconductor chips 102 in a lamination direction L and that has one end fixed to the base substrate 101. The plurality of semiconductor chips 102 are electrically connected together via the penetration electrode 103.

The semiconductor chip 102 includes a predetermined functional element such as a DRAM mounted on a chip substrate mainly formed of a semiconductor material, an insulator material, and the like. The number of laminations of the semiconductor chip 102 is not limited. In FIG. 1, the plurality of semiconductor chips 102 are shown to be spaced apart from each other but are actually in close contact with each other directly or so as to interpose an intermediate layer (adhesive layer or the like) without a gap.

The penetration electrode 103 is a columnar structure that electrically connects together functional elements mounted on a different semiconductor chip 102. In terms of a process property, an electric property, and a cost, the penetration electrode 103 can be preferably formed of only a copper or a material containing about 80% or more of copper as a principal component. Other materials for the penetration electrode 103 can include, for example, tungsten (W) or the like.

Any of a plurality of input/output (I/O) elements (transistors) 104 that perform a signal input/output operation is connected to each of the plurality of penetration electrodes 103 such that a functional element (not shown) connected to each of the plurality of penetration electrodes 103 performs an ON or OFF operation at a predetermined timing. FIG. 1 shows a case in which the input/output element 104 is mounted on the semiconductor chip 102 at an uppermost layer, but the input/output element 104 may be mounted on another semiconductor chip 102.

Figure 2:
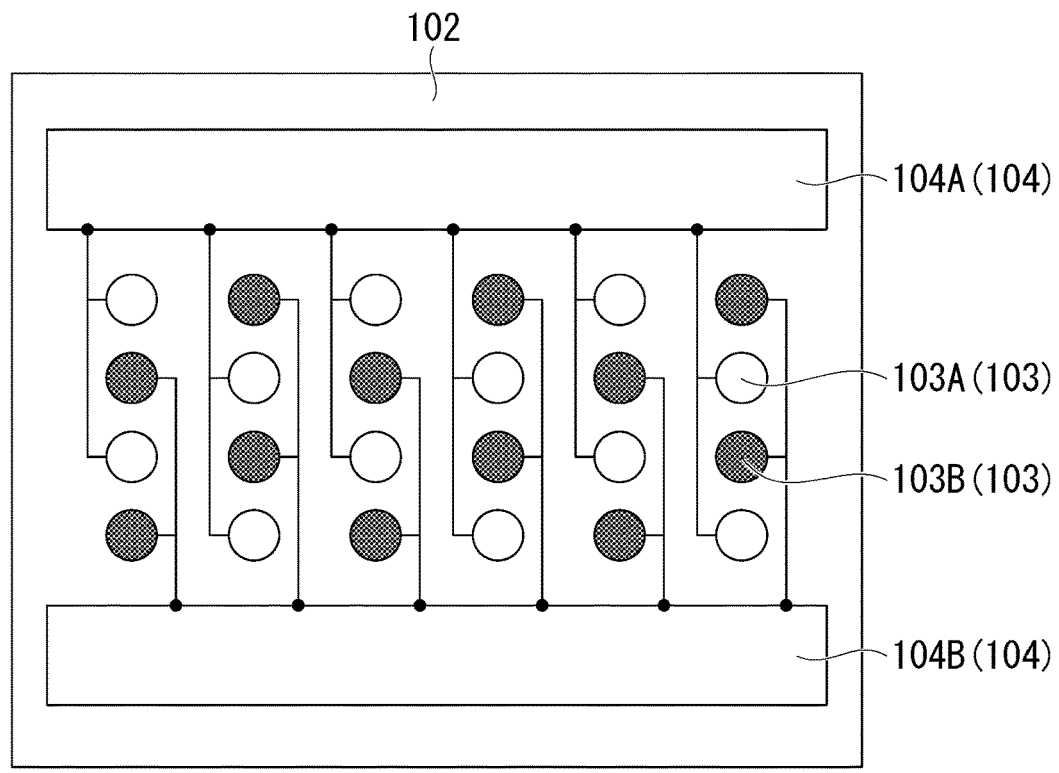
FIG. 2 is a plan view of the semiconductor apparatus of FIG. 1.

FIG. 2 is a plan view of the semiconductor apparatus 100 of FIG. 1 viewed from the side of the semiconductor chip 102 at the uppermost layer. The number of input/output elements 104 can be increased or decreased depending on the type of input/output signals that are generated simultaneously, but an example is shown in which two input/output elements 104A, 104B are arranged assuming that two types of input/output signals are generated.

The plurality of penetration electrodes 103 are made of the same material, have the same shape, and are arranged to form a pattern having predetermined regularity and symmetry. Here, an example is shown in which the plurality of penetration electrodes 103 are arranged at equal intervals along two directions that are substantially orthogonal to each other so as to form a checker pattern (square lattice pattern). Examples of arrangement patterns of the penetration electrode 103 include a pattern in which the penetration electrodes 103 are arranged at equal intervals along two directions that intersect with each other at about 60 degrees so as to form a staggered grating pattern, a pattern in which the penetration electrodes 103 are arranged at a position of a vertex of a regular hexagon without a gap so as to form a honeycomb pattern, and the like.

In order to accommodate recent increases in CPU/GPU speeds, it is necessary to increase the number of signals that can be processed in parallel. Therefore, the number of input/output elements 104 that perform the signal input/output and the number of penetration electrodes 103 that connect the input/output element 104 can be preferably made large. In the present embodiment, the semiconductor chips 102 are joined together via no welding member such as a bump directly or indirectly so as to interpose an adhesion layer. Thereby, it is possible to narrow the pitch between adjacent penetration electrodes 103 as much as possible, and it is possible to maximize the number of penetration electrodes 103 provided on a single semiconductor chip 102.

One penetration electrode 103A among the two adjacent penetration electrodes 103 is connected to the input/output element 104A, and another penetration electrode 103B among the two adjacent penetration electrodes 103 is connected to the input/output element 104B. The wiring method shown herein is an example and is not limited thereto. The input/output element 104A and the input/output element 104B have a configuration that performs an input/output (ON/OFF of the input/output signal) operation at a different timing from each other. That is, the other input/output element 104B has a configuration that stops applying an input/output signal to the connected penetration electrode 103B when the one input/output element 104A applies an input/output signal to the connected penetration electrode 103A. Conversely, the other input/output element 104B has a configuration that applies an input/output signal to the connected penetration electrode 103B when the one input/output element 104A stops applying an input/output signal to the connected penetration electrode 103A.

According to such a configuration, it is possible to avoid a problem of capacitive coupling of the input/output signal applied to any penetration electrode 103 with the input/output signal applied to another adjacent penetration electrode 103. Further, it is possible to prevent capacitive coupling of the input/output signal applied to any penetration electrode 103 with the input/output signal of the penetration electrode 103 that is located at a further distant position by being shielded by the adjacent penetration electrode 103. Accordingly, in the penetration electrode 103 of the present embodiment, it is possible to prevent noise generation associated with the capacitive coupling, and thereby, it is possible to perform the ON/OFF operation of the functional element in a stable state in which the noise effect is reduced.

Figure 3:
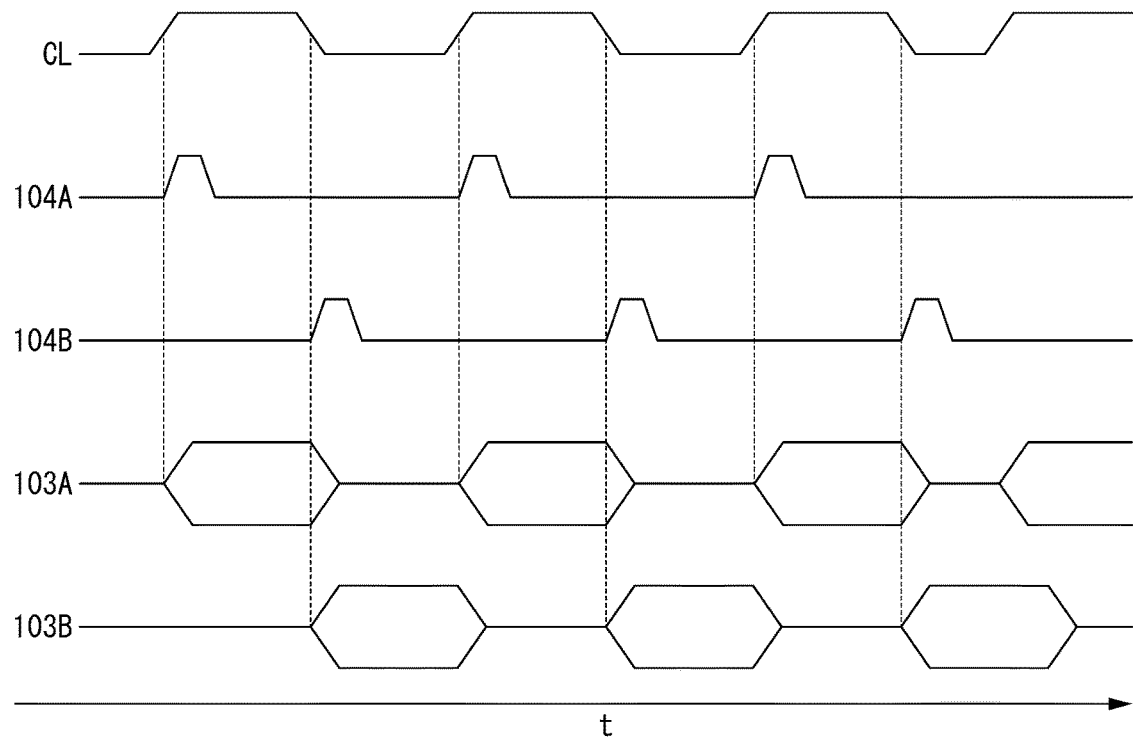
FIG. 3 is a view showing an example of a relationship between a clock signal and an input/output signal in the first embodiment.

The input/output element 104 is connected to a control clock signal CL that is input from the outside of the chip, and switching of the input/output signal by each of the input/output elements 104A, 104B can be performed by providing the control clock signal CL. FIG. 3 is a view showing an example of a temporal correlation among the control clock signal CL, control trigger signals by the input/output elements 104A, 104B, and input/output signals by the penetration electrodes 103A, 103B. A waveform (first stage from the top) of the clock signal generated by the control clock signal CL, waveforms (second and third stages from the top) of the control trigger signals generated by the input/output elements 104A, 104B, and waveforms (fourth and fifth stages from the top) of the input/output signals generated by the penetration electrodes 103A, 103B are shown in alignment with a time axis t.

As can be seen from the correlation between the waveform on the first stage from the top and the waveform on the second stage from the top, the input/output element 104A connected to one (the penetration electrode 103A) of the two adjacent penetration electrodes 103A, 103B has a configuration that performs the input/output operation at a timing of rising of the clock signal. Further, as can be seen from the correlation between the waveform on the first stage from the top and the waveform on the third stage from the top, the input/output element 104B connected to the other (the penetration electrode 103B) of the two adjacent penetration electrodes 103A, 103B has a configuration that performs the input/output operation at a timing of falling of the clock signal. According to such a configuration, it is possible to prevent a state in which the control trigger signal is applied simultaneously to the adjacent penetration electrodes 103A, 103B from occurring.

Figure 4:
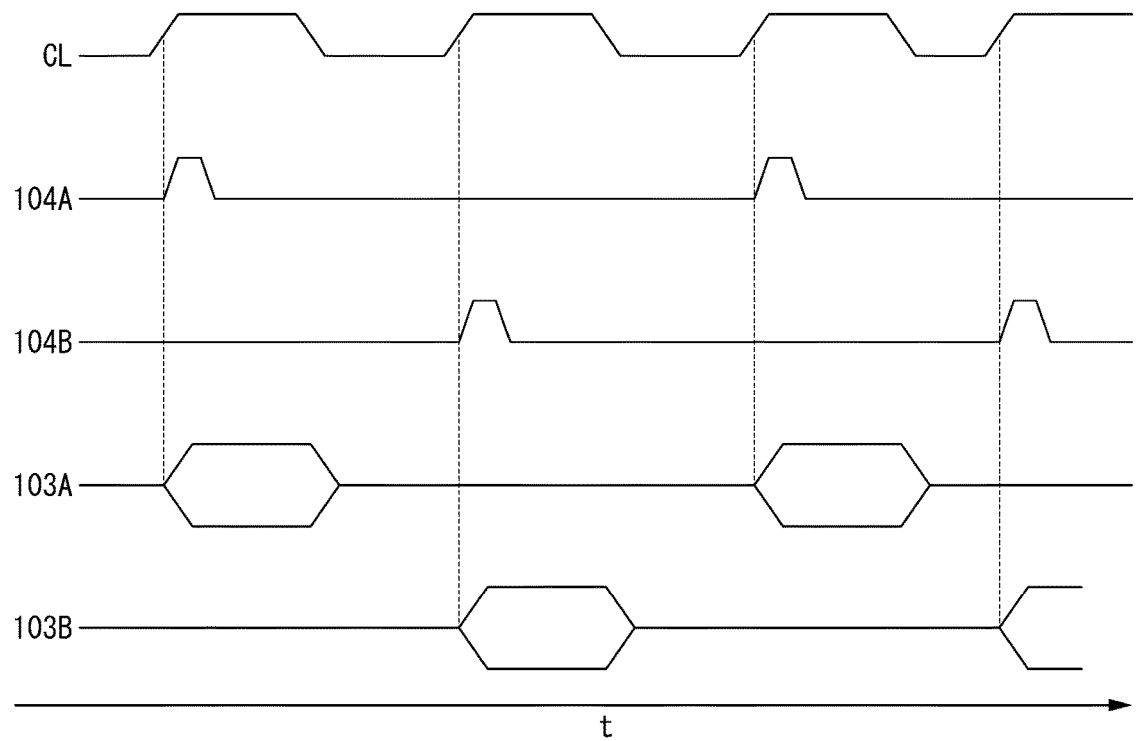
FIG. 4 is a view showing another example of a relationship between a clock signal and an input/output signal in the first embodiment.

FIG. 4 is a view showing another example of a temporal correlation among the control clock signal CL, control trigger signals by the input/output elements 104A, 104B, and input/output signals by the penetration electrodes 103A, 103B. As can be seen from the correlation between the waveform on the first stage from the top and the waveform on the second stage from the top, the input/output element 104A connected to one (the penetration electrode 103A) of the two adjacent penetration electrodes has a configuration that performs the input/output operation at a timing of rising in an odd cycle (at odd times) of the clock signal. Further, as can be seen from the correlation between the waveform on the first stage from the top and the waveform on the third stage from the top, the input/output element 104B connected to the other (the penetration electrode 103B) of the two adjacent penetration electrodes has a configuration that performs the input/output operation at a timing of rising in an even cycle (at even times) of the clock signal.

According to such a configuration, it is possible to prevent a state in which the input/output signal is applied simultaneously to the adjacent penetration electrodes 103A, 103B from occurring. The input/output element 104A may have a configuration that performs the input/output operation at a timing of falling rather than rising in an odd cycle of the clock signal. The input/output element 104B may have a configuration that performs the input/output operation at a timing of falling rather than rising in an even cycle of the clock signal.

By using two types of input/output elements 104A, 104B and shifting input/output timings of the penetration electrode 103A and the penetration electrode 103B from each other, the number of penetration electrodes 103 that operate simultaneously is halved. However, as the total number of arranged penetration electrodes 103 becomes larger, this effect becomes smaller, and when the total number is equal to or more than 100, this effect becomes negligible.

In a case where the number of penetration electrodes 103 connected to a single input/output element 104 is large, since the penetration electrodes 103 are arranged over a large area, the difference between a length of wiring that connects the input/output element 104 to the penetration electrode 103 located at a position close to the input/output element 104 and a length of wiring that connects the input/output element 104 to the penetration electrode 103 located at a position far from the input/output element 104 becomes remarkable. Therefore, a plurality of input/output elements 104 having the same type may be arranged, and the plurality of penetration electrodes 103 operated at the same timing may be connected to an input/output element located at a position close each of the plurality of penetration electrodes 103. Thereby, it is possible to reduce the effect of the difference between wiring lengths of the penetration electrodes 103.

As described above, in the semiconductor apparatus 100 according to the present embodiment, functional elements on different semiconductor chips 102 are connected together via the plurality of penetration electrodes 103. The input/output element 104A connected to the first of two adjacent penetration electrodes 103 and the input/output element 104B connected to the second of two adjacent penetration electrodes 103 have a configuration that performs the input/output at a different timing from each other. Therefore, the input/output signal is not applied simultaneously to the two adjacent penetration electrodes 103. That is, when one changes from a H state to a L state or from the L state to the H state, another maintains the H state or the L state.

Accordingly, in a case where the plurality of penetration electrodes 103 are formed at a narrow pitch, it is possible to reduce capacitive coupling of the input/output signal applied to any of the penetration electrodes 103 with the input/ output signal applied to another adjacent penetration electrode or a penetration electrode arranged at a farther position. Thereby, it is possible to perform the ON/OFF operation of the functional element in a stable state in which the noise effect associated with the capacitive coupling is reduced.

Second Embodiment

Figure 5:
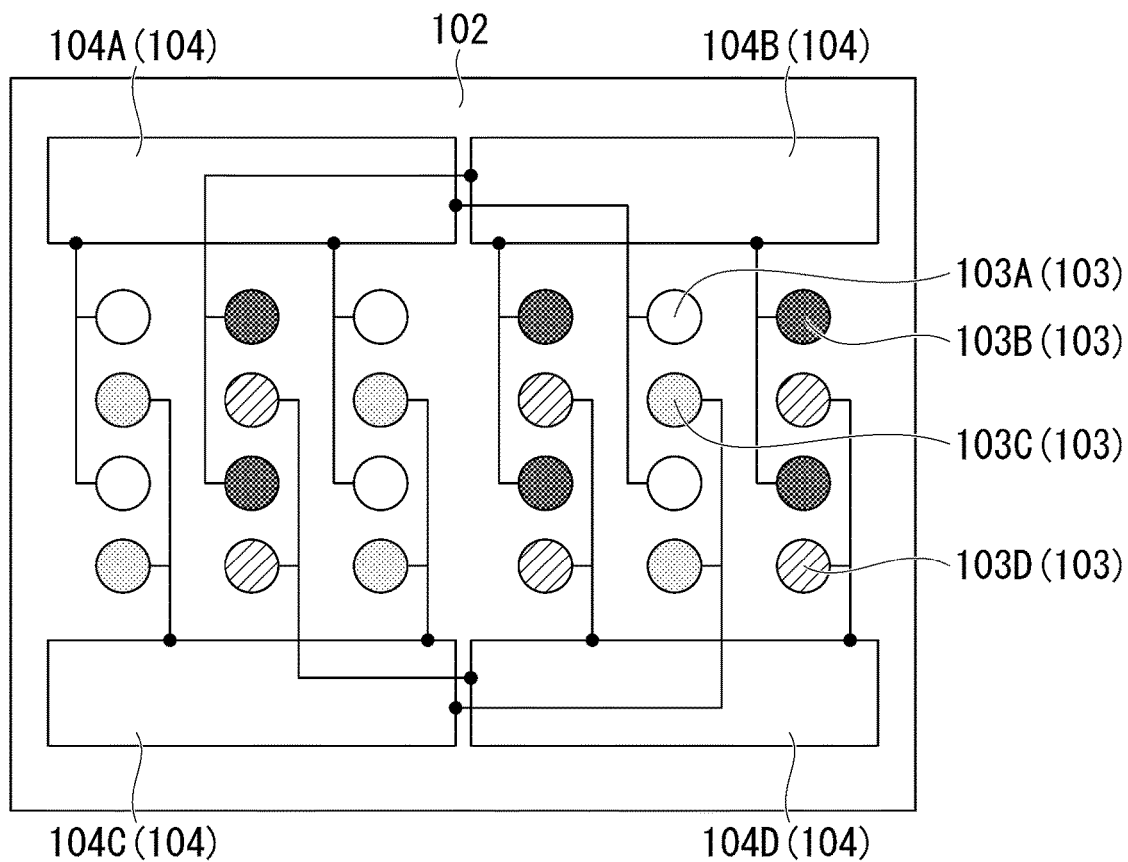
FIG. 5 is a perspective view of a semiconductor apparatus according to a second embodiment of the present invention.

FIG. 5 is a plan view of a semiconductor apparatus 200 according to a second embodiment of the present invention viewed from the side of the semiconductor chip 102 at the uppermost layer. The semiconductor apparatus 200 includes four input/output elements 104A, 104B, 104C, 104D assuming that four types of input/output signals are generated. The other configuration is similar to the configuration of the semiconductor apparatus 100 of the first embodiment, and a portion that corresponds to the semiconductor apparatus 100 is indicated by the same reference numeral regardless of the difference of the shape.

A plurality of input/output elements 103 are connected to a control clock signal CL (not shown) that generates a clock signal. The plurality of penetration electrodes 103 are made of the same material, have the same shape, and are arranged to form a pattern having predetermined regularity and symmetry. Here, similarly to the first embodiment, an example is shown in which the plurality of penetration electrodes 103 are arranged so as to form a checker pattern. However, the plurality of penetration electrodes may be arranged so as to form a different pattern such as a staggered grating pattern, a honeycomb pattern, or the like.

Similarly to the first embodiment, the input/output element 104A connected to the first of two adjacent penetration electrodes 103 and the input/output element 104B connected to the second of two adjacent penetration electrodes 103 have a configuration that performs an input/output operation at a different timing from each other, but the second embodiment differs from the first embodiment in the following point. In the second embodiment, the input/output elements 104 which are each connected to one of the penetration electrodes 103 that are adjacent in one direction and the input/output elements 104 which are each connected to one of the penetration electrodes 103 that are adjacent in another direction have a configuration that performs a signal input/output operation at a different timing from each other. That is, in the second embodiment, penetration electrodes adjacent to one penetration electrode and penetration electrodes adjacent to the one penetration electrode in a different direction have a configuration that operates at a different timing from each other.

In FIG. 5, penetration electrodes 103A, 103B that are adjacent in a lateral direction ($D_1$ direction) is connected to the input/output elements 104A, 104B, respectively. Penetration electrodes 103A, 103C that are adjacent in a longitudinal direction ($D_2$ direction) are connected to the input/output elements 104A, 104C, respectively. Penetration electrodes 103A, 103D that are adjacent in a rightward downward oblique direction ($D_3$ direction) are connected to the input/output elements 104A, 104D, respectively. Penetration electrodes 103B, 103C that are adjacent in a rightward upward oblique direction ($D_4$ direction) are connected to the input/output elements 104B, 104C, respectively. The wiring method shown herein is an example and is not limited thereto.

The four input/output elements 104A, 104B, 104C, 104D have a different timing when the input/output (ON/OFF of the input/output signal) is performed on the connected penetration electrode.

Accordingly, for example, with reference to the penetration electrode 103A, the adjacent penetration electrode 103B in the $D_1$ direction, the adjacent penetration electrode 103C in the $D_2$ direction, and the adjacent penetration electrode 103D in the $D_3$ direction operate at a different timing from each other. The same applies to a case in which each of the penetration electrodes 103B, 103C, 103D is a reference.

That is, when an input/output signal is applied to one penetration electrode among the four adjacent penetration electrodes 103A, 103B, 103C, 103D, the application of the input/output signal to the other three penetration electrodes is stopped. According to such a configuration, it is possible to avoid a problem of capacitive coupling of the input/output signal applied to any penetration electrode 103 with the input/output signal applied to another adjacent penetration electrode 103. Further, it is possible to prevent capacitive coupling of the input/output signal applied to any penetration electrode 103 with the input/output signal of the penetration electrode 103 that is located at a further distant position by being shielded by the adjacent penetration electrode 103.

The semiconductor apparatus 100 of the first embodiment has a configuration that avoids only capacitive coupling between the input/output signals applied to the adjacent penetration electrodes in the $D_1$ direction and the $D_2$ direction. In the second embodiment, the capacitive coupling between the input/output signals applied to the adjacent penetration electrodes in the $D_3$ direction and the $D_4$ direction in addition to the $D_1$ direction and the $D_2$ direction is avoided. Thereby, in the second embodiment, it is possible to further reduce the effect of the noise, and it is possible to perform the ON/OFF operation of the functional element in a further stable state.

Figure 6:
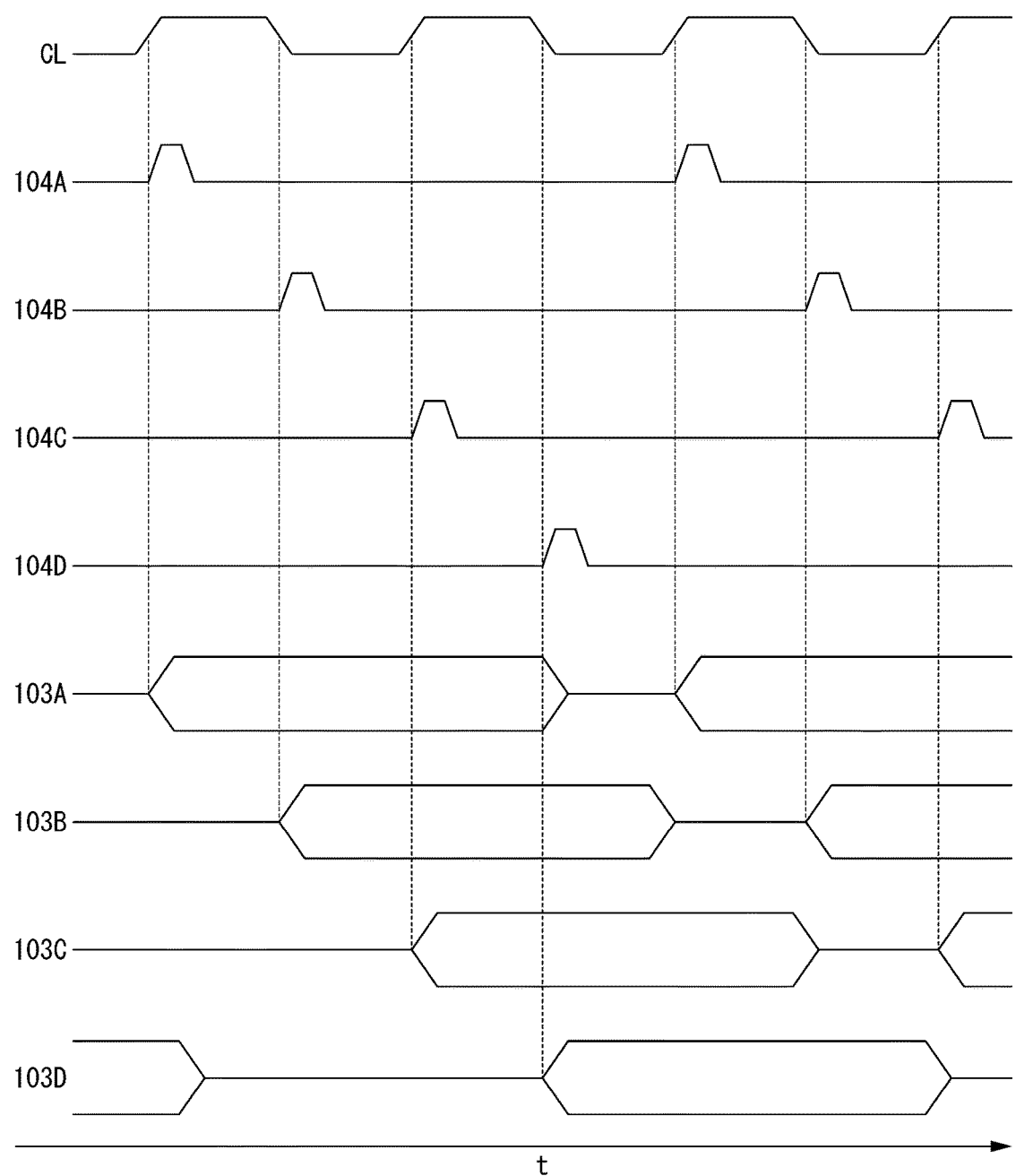
FIG. 6 is a view showing an example of a relationship between a clock signal and an input/output signal in the second embodiment.

FIG. 6 is a view showing an example of a temporal correlation among the control clock signal CL, control trigger signals by the input/output elements 104A, 104B, 104C, 104D, and input/output signals by the penetration electrodes 103A, 103B, 103C, 103D. A waveform (first stage from the top) of the clock signal generated by the control clock signal CL, waveforms (second, third, fourth, and fifth stages from the top) of the control trigger signals generated by the input/output elements 104A, 104B, 104C, 104D, and waveforms (sixth, seventh, eighth, and ninth stages from the top) of the input/output signals generated by the penetration electrodes 103A, 103B, 103C, 103D are shown in alignment with a time axis t.

As can be seen from the correlation between the waveform on the first stage from the top and the waveform on the second stage from the top, the input/output element 104A connected to the penetration electrode 103A has a configuration that performs the input/output operation at a timing of rising in an odd cycle (at odd times) of the clock signal. Further, as can be seen from the correlation between the waveform on the first stage from the top and the waveform on the third stage from the top, the input/output element 104B connected to the penetration electrode 103B has a configuration that performs the input/output operation at a timing of falling in the odd cycle of the clock signal. Further, as can be seen from the correlation between the waveform on the first stage from the top and the waveform on the fourth stage from the top, the input/output element 104C connected to the penetration electrode 103C has a configuration that performs the input/output operation at a timing of rising in an even cycle (at even times) of the clock signal. Further, as can be seen from the correlation between the waveform on the first stage from the top and the waveform on the fifth stage from the top, the input/output element 104D connected to the penetration electrode 103D has a configuration that performs the input/output operation at a timing of falling in the even cycle of the clock signal. According to such a configuration, it is possible to prevent a state in which the input/output signal is applied simultaneously to the adjacent penetration electrodes 103A, 103B, 103C, 103D from occurring.

As described above, in the semiconductor apparatus 200 according to the present embodiment, in any direction including the oblique direction, the two adjacent penetration electrodes 103 have a configuration that operates at a different timing from each other. Therefore, in any direction, the input/output signal is not applied simultaneously to the two adjacent penetration electrodes 103, and when one is in an ON state, another is in an OFF state. That is, when one changes from a H state to a L state or from the L state to the H state, another maintains the H state or the L state.

Accordingly, in a case where the plurality of penetration electrodes 103 are formed at a narrow pitch, it is possible to reduce capacitive coupling of the input/output signal applied to any of the penetration electrodes 103 with the input/output signal applied to another adjacent penetration electrode or a penetration electrode arranged at a farther position regardless of the direction. Thereby, it is possible to perform the ON/OFF operation of the functional element in a stable state in which the noise effect associated with the capacitive coupling is reduced.

What is claimed is:

1. A semiconductor apparatus comprising:
a plurality of semiconductor chips that are laminated;
a plurality of penetration electrodes that penetrate in a lamination direction through the plurality of semiconductor chips and that electrically connect together the plurality of semiconductor chips; and
a plurality of input/output elements that are configured to perform a signal input/output operation to the plurality of penetration electrodes,
wherein the semiconductor chips are joined together via no bump,
one of the plurality of input/output elements is connected to each of the plurality of penetration electrodes such that a functional element connected to each of the plurality of penetration electrodes performs an ON or OFF operation at a predetermined timing, and
the input/output element connected to a first of two adjacent penetration electrodes among the plurality of penetration electrodes and the input/output element connected to a second of two adjacent penetration electrodes are configured to perform the signal input/output operation at a different timing from each other.

2. The semiconductor apparatus according to claim 1,
wherein the plurality of input/output elements are connected to an external electric power source that is configured to generate a clock signal,
the input/output element connected to the first of two adjacent penetration electrodes is configured to perform an input/output operation at a timing of rising of the generated clock signal, and
the input/output element connected to the second of two adjacent penetration electrodes is configured to perform an input/output operation at a timing of falling of the generated clock signal.

3. The semiconductor apparatus according to claim 1,
wherein the plurality of input/output elements are connected to an external electric power source that is configured to generate a clock signal,
the input/output element connected to the first of two adjacent penetration electrodes is configured to perform an input/output operation at a timing of rising or falling in an odd cycle of the generated clock signal, and
the input/output element connected to the second of two adjacent penetration electrodes is configured to perform an input/output operation at a timing of rising or falling in an even cycle of the generated clock signal.

4. The semiconductor apparatus according to claim
wherein the plurality of input/output elements is connected to an external electric power source that is configured to generate a clock signal, and
the input/output elements which are each connected to one of the penetration electrodes that are adjacent in a first direction and the input/output elements which are each connected to one of the penetration electrodes that are adjacent in a second direction are configured to perform the signal input/output operation at a different timing from each other.

5. The semiconductor apparatus according to claim 4,
wherein the input/output element connected to a first of two penetration electrodes that are adjacent in the first direction is configured to perform an input/output operation at a timing of rising in an odd cycle of the generated clock signal,
the input/output element connected to a second of two penetration electrodes that are adjacent in the first direction is configured to perform an input/output operation at a timing of falling in the odd cycle of the generated clock signal,
the input/output element connected to a first of two penetration electrodes that are adjacent in the second direction is configured to perform an input/output operation at a timing of rising in an even cycle of the generated clock signal, and
the input/output element connected to a second of two penetration electrodes that are adjacent in the second direction is configured to perform an input/output operation at a timing of falling in the even cycle of the generated clock signal.

6. The semiconductor apparatus according to claim 1,
wherein the plurality of penetration electrodes are arranged to form a checker pattern.

7. The semiconductor apparatus according to claim 1,
wherein the plurality of penetration electrodes are arranged to form a staggered grating pattern.

8. The semiconductor apparatus according to claim 1,
wherein the plurality of penetration electrodes are arranged to form a honeycomb pattern.

* * * * *